(12) United States Patent
Seningen et al.

(10) Patent No.: US 8,482,315 B2
(45) Date of Patent: Jul. 9, 2013

(54) ONE-OF-N N-NARY LOGIC IMPLEMENTATION OF A STORAGE CELL

(75) Inventors: Michael R. Seningen, Austin, TX (US); Raymond C. Yeung, Austin, TX (US)

(73) Assignee: Apple Inc., Cupertino, CA (US)

( * ) Notice: Subject to any disclaimer, the term of this patent is extended or adjusted under 35 U.S.C. 154(b) by 1611 days.

(21) Appl. No.: 13/215,287

(22) Filed: Aug. 23, 2011

(65) Prior Publication Data
US 2013/0049805 A1 Feb. 28, 2013

(51) Int. Cl.
*H03K 19/00* (2006.01)
*G11C 7/02* (2006.01)

(52) U.S. Cl.
USPC .................. 326/59; 326/60; 326/93; 326/95; 326/98; 365/207; 365/189.08

(58) Field of Classification Search
USPC .............. 326/93–98; 365/49, 189.07, 189.08, 365/154, 203, 205, 207
See application file for complete search history.

(56) References Cited

U.S. PATENT DOCUMENTS

| | | | |
|---|---|---|---|
| 5,850,157 A | 12/1998 | Zhu et al. | |
| 6,066,965 A | 5/2000 | Blomgren | |
| 6,069,497 A | 5/2000 | Blomgren et al. | |
| 6,202,194 B1 * | 3/2001 | Seningen et al. | 257/206 |
| 6,317,350 B1 * | 11/2001 | Pereira et al. | 365/49.1 |
| 6,529,045 B2 | 3/2003 | Ye et al. | |
| 6,570,408 B2 | 5/2003 | Nowka | |
| 6,590,423 B1 | 7/2003 | Wong | |
| 6,714,045 B2 * | 3/2004 | Potter et al. | 326/59 |
| 6,911,846 B1 * | 6/2005 | Blomgren et al. | 326/97 |
| 6,956,406 B2 * | 10/2005 | Seningen et al. | 326/121 |
| 7,268,633 B2 | 9/2007 | von Kaenel | |
| 7,395,286 B1 | 7/2008 | Koh et al. | |
| 7,598,774 B2 | 10/2009 | Belluomini et al. | |
| 7,679,979 B1 * | 3/2010 | Kim | 365/205 |
| 7,782,126 B2 | 8/2010 | Cagno et al. | |
| 7,894,226 B2 * | 2/2011 | Ali et al. | 365/49.1 |
| 7,932,750 B2 * | 4/2011 | Kim | 326/93 |
| 8,169,246 B2 * | 5/2012 | Malik et al. | 327/211 |
| 8,174,918 B2 * | 5/2012 | Hess | 365/203 |
| 2003/0110404 A1 | 6/2003 | Seningen et al. | |
| 2009/0294822 A1 | 12/2009 | Batude et al. | |
| 2010/0052743 A1 | 3/2010 | Kamizuma et al. | |
| 2010/0117703 A1 | 5/2010 | Zhu et al. | |
| 2011/0140753 A1 | 6/2011 | Papaefthymiou et al. | |
| 2012/0151426 A1 | 6/2012 | Marrou | |

OTHER PUBLICATIONS

U.S. Appl. No. 13/454,830, entitled "Method for Testing Integrated Circuits with Hysteresis", by Anh T. Hoang, Brian S. Park and Patrick D. McNamara, filed Apr. 24, 2012. 30 pages.

(Continued)

*Primary Examiner* — Vibol Tan
(74) *Attorney, Agent, or Firm* — Rory D. Rankin; Meyertons, Hood, Kivlin, Kowert & Goetzel, P.C.

(57) ABSTRACT

A one-of-n storage cell for use in an N-nary dynamic logic (NDL) circuit. The storage cell may accept an input value and provide a complemented output value that corresponds to the input value. However, if an input value that corresponds to a precharge input value is received, the output value remains the previous output value. The storage cell may be implemented to accept either inverted or non-inverted one-of-n NDL signals and to provide as an output either non-inverted or inverted one-of-N NDL signals, respectively, where N is greater than two.

20 Claims, 6 Drawing Sheets

OTHER PUBLICATIONS

U.S. Appl. No. 13/274,662, entitled "Reduced Voltage Swing Clock Distribution", by Michael E. Runas and James S. Blomgren, filed Oct. 17, 2011. 36 pages.

Stroud; "Anatomy of a Flip-Flop ELEC 4200 Set-Reset (SR) Latch;" Auburn University, Aug. 2006.

* cited by examiner

ONE-OF-N N-NARY LOGIC IMPLEMENTATION OF A STORAGE CELL

BACKGROUND

1. Technical Field

This disclosure relates to integrated circuits, and more particularly to one-of-n logic circuits.

2. Description of the Related Art

Generally speaking, N-nary logic, which is commonly referred to as N-nary dynamic logic or NDL, refers to a logic family which supports a variety of signal encodings that are of the 1 of n form where n may be any integer greater than one. A more common implementation of NDL uses 1 of four encodings, which uses four wires or signals to indicate one of four possible values.

In the N-nary design style, a 1 of four (or a 1 of n) signal corresponds to a bundle of wires kept together throughout the inter-cell route, which requires the assertion of no more than one wire either while precharging or evaluating. A traditional binary logic design in comparison would use only two wires to indicate four values by asserting neither, one, or both wires together. The number of additional wires represents one difference of the N-nary logic style, and on the surface makes it appear unacceptable for use in microprocessor designs. One-of-n signals are less information efficient than traditional signals because they require at least twice the number of wires, but N-nary signals have the advantage of including signal validation information, which is not possible with traditional signals. It is this additional information (the fact that when zero wires are asserted the result is not yet known) that indirectly allows us to eliminate P-channel logic and all of the series synchronization elements required in traditional designs.

In designs that use the one-of-n encodings, it is sometimes necessary to use a storage element. However, to use a conventional storage element, the one-of-n signal encoding must first be converted to a one of one encoding, which is inefficient. In addition, conventional storage elements are typically clocked devices, which causes additional power consumption.

SUMMARY OF THE DISCLOSURE

Various embodiments of a one-of-n storage cell of an integrated circuit are disclosed. Broadly speaking, a one-of-n storage cell is contemplated for use in an N-nary dynamic logic (NDL) circuit. The storage cell may accept an input value and provide a complemented output value that corresponds to the input value. However, if an input value that corresponds to a precharge input value is received, the output value remains the previous output value. The storage cell may be implemented to accept either inverted or non-inverted one-of-n NDL signals and to provide as an output either non-inverted or inverted one-of-N NDL signals, respectively, where N is greater than two.

In one embodiment, the storage cell includes a number of logic tree circuits that may receive an input value including a number of input signals and provide a corresponding output value including a number of output signals in response to receiving the input value. Depending on the configuration, one of the of input signals or the output signals may correspond to N-Nary one-of-N signals, where N is greater than two. In addition, in response to receiving an input value that corresponds to a precharge input value, the logic tree circuits may output a last previous output value, and for each other input value, the logic tree circuits may output a complemented input value.

In one specific implementation, the input value is an encoded value and in response to the input signals corresponding to N-Nary one-of-N signals, at most one signal of the input value is asserted to a logic value of one at any given time for a valid input value.

In yet another specific implementation, the output value is an encoded value and in response to the output signals corresponding to N-Nary one-of-N signals, at most one signal of the output value is asserted to a logic value of one at any given time for a valid output value.

Figure 1:
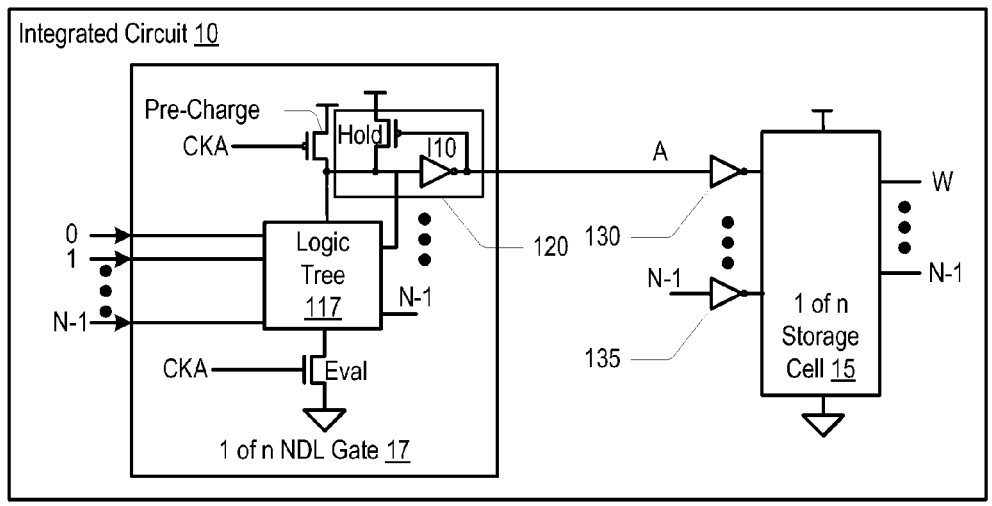
FIG. 1 is a block diagram of an integrated circuit including one embodiment of a one-of-n storage cell.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of an integrated circuit including one embodiment of a one-of-n storage cell is shown. The integrated circuit 10 includes an exemplary one-of-n n-nary dynamic logic (NDL) gate 17 that is coupled to a one-of-n storage cell 15. As shown, the NDL gate 17 has n inputs designated 0 through n−1, and the storage cell 15 has n inputs that are designated A through n−1.

In the illustrated embodiment, the NDL gate 17 includes an evaluation circuit, which includes the transistor designated 'eval', a pre-charge circuit, which includes the transistor designated as 'pre-charge' and a logic tree circuit 117. In addition, as is typical of most NDL gates, the NDL gate 17 also includes an output circuit 120 which includes an inverter I10 and a holding transistor designated 'hold'. In various embodiments, the CKA clock signal precharges the output during a precharge pulse portion (i.e., CKA is low) of the CKA signal. The output hold circuit 120 latches the precharge value. When CKA transitions to a logic value of one, the input value that appears at inputs to the logic tree 117 are evaluated. Typically, the logic tree of an NDL gate includes a stack of n-type transistors configured to perform a particular logic function, for example. If the logic evaluates to a logic zero, the eval transistor provides a path to ground, and for that portion of the CKA clock cycle, the output value will correspond to the input value based upon the logic function.

Generally speaking, an NDL gate such as NDL gate 17 provides an output which has zero or at most one asserted signal at any given time. This is sometimes referred to as zero or one-hot signaling. Accordingly, the NDL gate 17 provides one-hot signaling to the one-of-n storage cell 15. As will be described in greater detail below in conjunction with the description of FIG. 5, in various embodiments, the one-of-n storage cell 15 may be an inverting storage cell. In addition, in one particular embodiment the one-of-n storage cell 15 may require inverted signals at the input and provide the complement at the output. Thus in the embodiment shown in FIG. 1, inverters 130 and 135 locally invert the signals to provide $\overline{A}$ through $\overline{n-1}$ to the input of the one-of-n storage cell 15. The one-of-n storage cell 15 then provides complemented signals W through n−1 at the output.

It is noted that there are other ways to send the signals to the storage cell 15. Accordingly, FIG. 2 through FIG. 4 illustrate three additional signaling configurations for use with the one-of-n storage cell 15.

Figure 2:
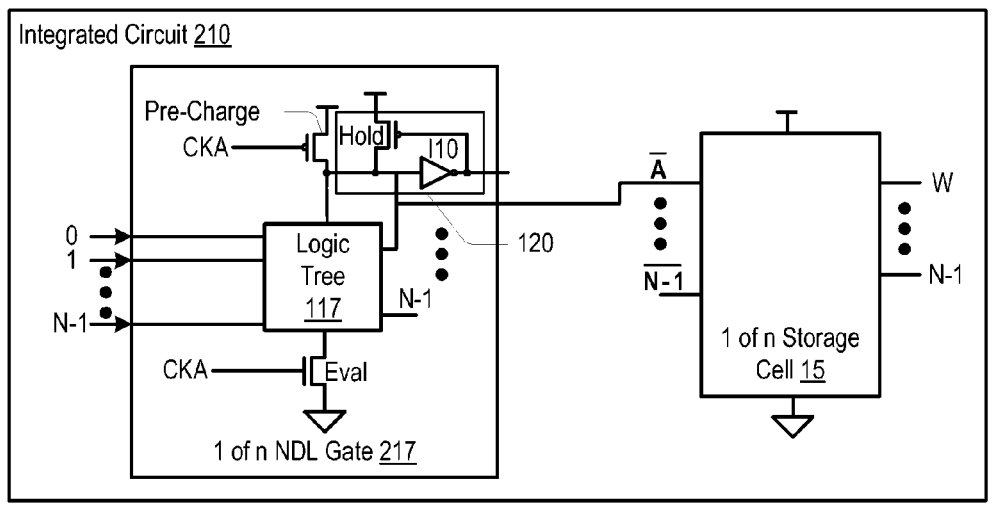
FIG. 2 is a block diagram of another embodiment of an integrated circuit including the one-of-n storage cell of FIG. 1.

Referring to FIG. 2, a block diagram of another embodiment of an integrated circuit including the one-of-n storage cell of FIG. 1 is shown. Components that correspond to those shown in FIG. 1 are numbered identically for clarity and simplicity. The integrated circuit 210 of FIG. 2 is similar to integrated circuit 10 of FIG. 1, in that it includes an NDL gate 217 that is coupled to the one-of-n storage cell 15. The difference lies in the point at which the output signal is taken from the NDL gate 217 and that there are no local inverters at the input of the one-of-n storage cell 15.

More particularly, although not an ideal configuration, the output signal may be taken from the NDL gate 217 at the input of the output inverter I10. Doing so would provide inverted input signals $\overline{A}$ through $\overline{n-1}$ to the one-of-n storage cell 15. It is noted that as described above, most NDL gates expect to receive a one-hot input. Transmitting the inverted signals removes the need for the local inverters at the input of the one-of-n storage cell 15.

Figure 3:
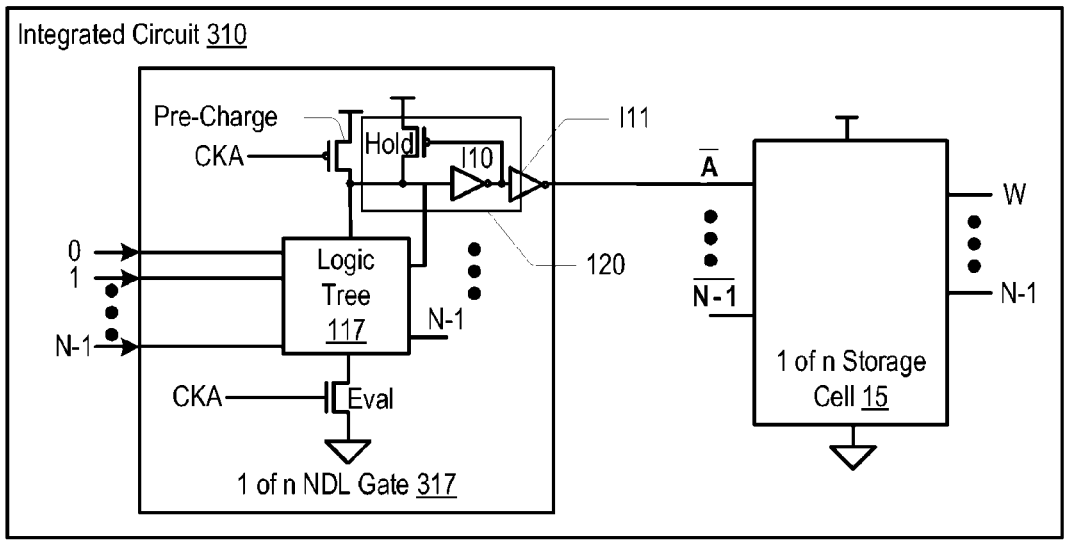
FIG. 3 is a block diagram of another embodiment of an integrated circuit including the one-of-n storage cell of FIG. 1.
Figure 4:
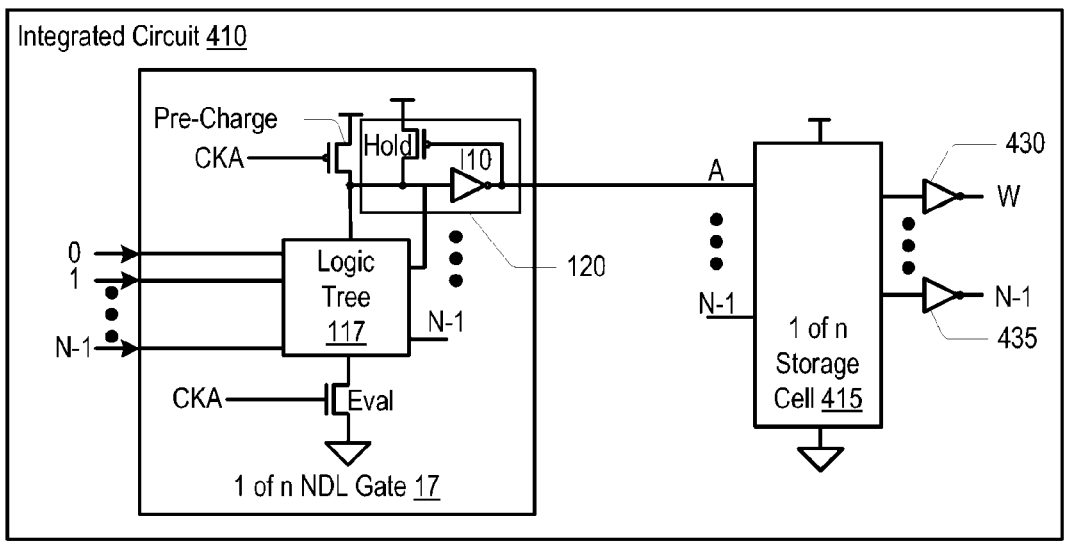
FIG. 4 is a block diagram of an integrated circuit including another embodiment of a one-of-n storage cell.

Turning to FIG. 3, a block diagram of another embodiment of an integrated circuit including the one-of-n storage cell of FIG. 1 is shown. Components that correspond to those shown in FIG. 1 and FIG. 2 are numbered identically for clarity and simplicity. The integrated circuit 310 of FIG. 3 is similar to integrated circuit 10 of FIG. 1 and integrated circuit 210 of FIG. 2, in that it includes an NDL gate 317 that is coupled to the one-of-n storage cell 15. The difference lies in the point at which the output signal is taken from the NDL gate 317 and that there are no local inverters at the input of the one-of-n storage cell 15.

As shown, the NDL gate 317 includes an additional inverter I11 at its output. Accordingly, similar to the embodiment of FIG. 2, the signals sent to the one-of-n storage cell 15 are inverted (e.g., $\overline{A}$ through $\overline{n-1}$).

Referring to FIG. 4, a block diagram of another embodiment of an integrated circuit including the one-of-n storage cell of FIG. 1 is shown. Components that correspond to those shown in FIG. 1 through FIG. 3 are numbered identically for clarity and simplicity. The integrated circuit 410 of FIG. 4 is similar to integrated circuit 10 of FIG. 1, in that it includes an NDL gate 17 that is coupled to the one-of-n storage cell 415. The difference is that the one-of-n storage cell 415 accepts non-inverted signals at its input and provides the complement at its output. However, since downstream NDL gates may expect to see one-hot signaling, there is local inversion at the output of the one-of-n storage cell 415 using inverters 430 and 435, for example.

Figure 5:
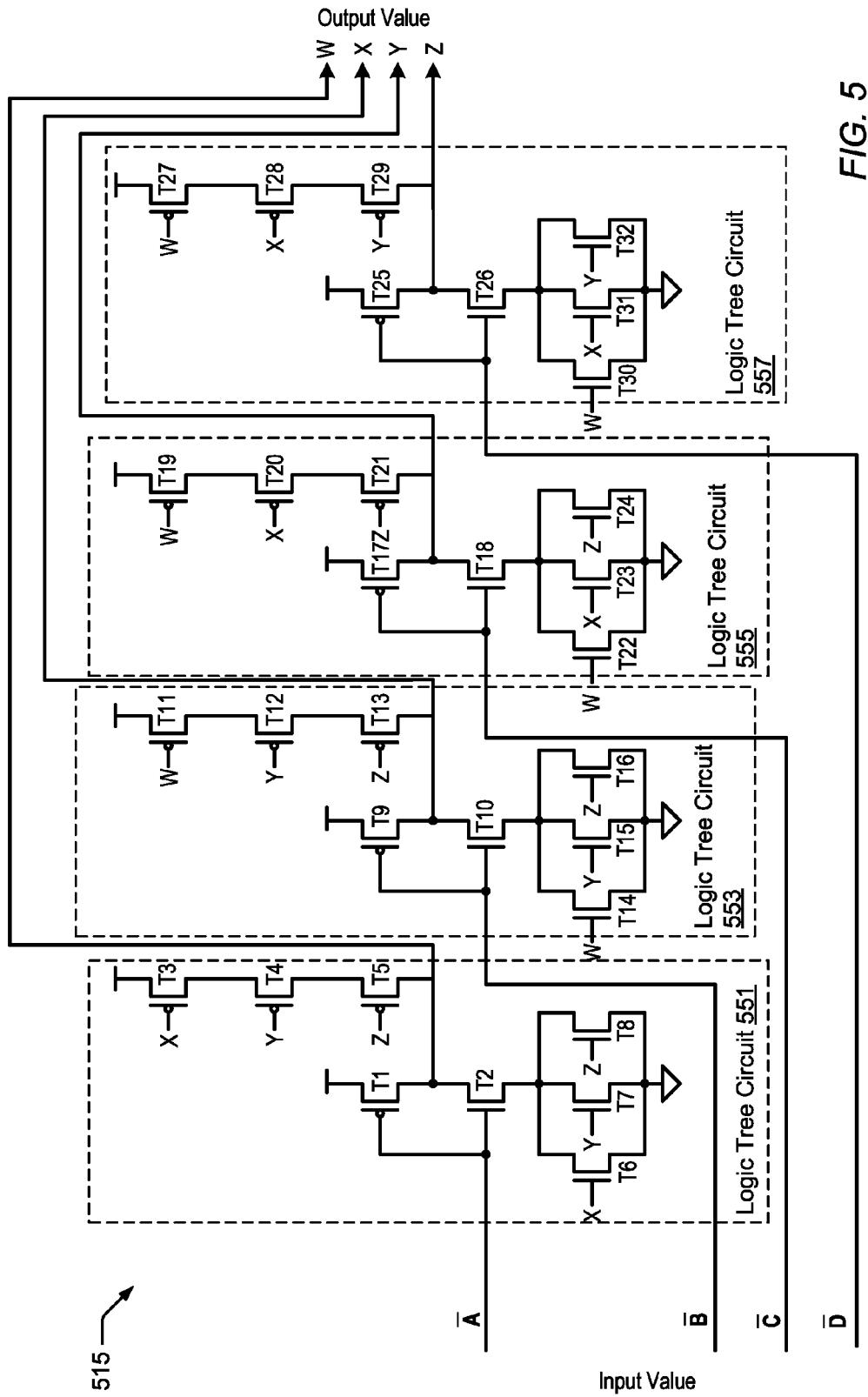
FIG. 5 is a block diagram of one embodiment of a one of four implementation of the storage cell of FIG. 1.

Turning to FIG. 5, a block diagram of one embodiment of a one-of-four implementation of the storage cell of FIG. 1 is shown. The storage cell 515 includes four inputs designated $\overline{A}$, $\overline{B}$, $\overline{C}$, and $\overline{D}$, and four outputs designated W, X, Y, and Z. The storage cell 515 also includes four logic tree circuits designated 551, 553, 555, and 557. Each logic tree circuit receives a respective input signal, and provides a respective corresponding output signal. For example, logic tree circuit 551 receives the $\overline{A}$ input signal and provides the W output signal, the logic tree circuit 553 receives the $\overline{B}$ input signal and provides the X output signal, and so on. In addition, the output of each logic tree circuit is fed back to the other three logic tree circuits. For example, the logic tree circuit 551 provides output W and receives feedback from output signals X, Y, and Z. Similarly, logic tree circuit 553 provides the X output and receives W, Y, and Z., and likewise for logic tree circuits 555 and 557.

As shown in FIG. 5, each logic tree circuit includes an input inverter that includes series-coupled transistors T1 and T2. The node between the transistors serves as the output node for that logic tree circuit. In addition, each logic tree circuit includes a series stack of three p-type transistors (e.g., T3, T4, and T5) coupled between the voltage supply (e.g., VDD), and the output node. Each logic tree circuit further includes three parallel-connected n-type transistors (e.g., T6, T7, and T8) coupled between the circuit ground reference and the output node. The remaining logic tree circuits are similarly connected and include transistors T9-T32.

The interconnection of the transistors in each logic tree circuit provides outputs that correspond to inputs as shown in the truth table shown in Table 1 below. In the illustrated embodiment, the storage cell 515 is an inverting cell, in which the output value corresponds to a complemented input value, with the exception of when all the inputs are all ones. This input value corresponds to a pre-charge input value. This is the storage (or latched) state of the storage cell, and corresponds to the (inverted) value produced by a sending NDL gate during the pre-charge portion of the cycle. Thus, the storage cell 15 may hold the input value or a next NDL gate, while the sending NDL gate goes into pre-charge.

TABLE 1

Truth table for the 1 of 4 storage cell

| $\overline{A}$ | $\overline{B}$ | $\overline{C}$ | $\overline{D}$ | W | X | Y | Z |
|---|---|---|---|---|---|---|---|
| 1 | 1 | 1 | 1 | W | X | Y | Z |
| 1 | 1 | 1 | 0 | 0 | 0 | 0 | 1 |
| 1 | 1 | 0 | 1 | 0 | 0 | 1 | 0 |
| 1 | 0 | 1 | 1 | 0 | 1 | 0 | 0 |
| 0 | 1 | 1 | 1 | 1 | 0 | 0 | 0 |

The inputs are listed on the left side of the truth table, and the outputs are on the right side. As shown, when the inputs are all ones, the output remains the same value that was output from the previous input value. In all other cases the output value is a complemented input value.

In the present one-of four embodiment of FIG. 5, there are four logic tree circuits, each having three p-type series-connected transistors and three n-type parallel-connected transistors. The general case for a one-of-n storage cell may be stated as having n logic tree circuits, each having n−1 p-type series-connected transistors and n−1 n-type parallel-connected transistors. Such a generalized embodiment is shown in FIG. 6.

Figure 6:
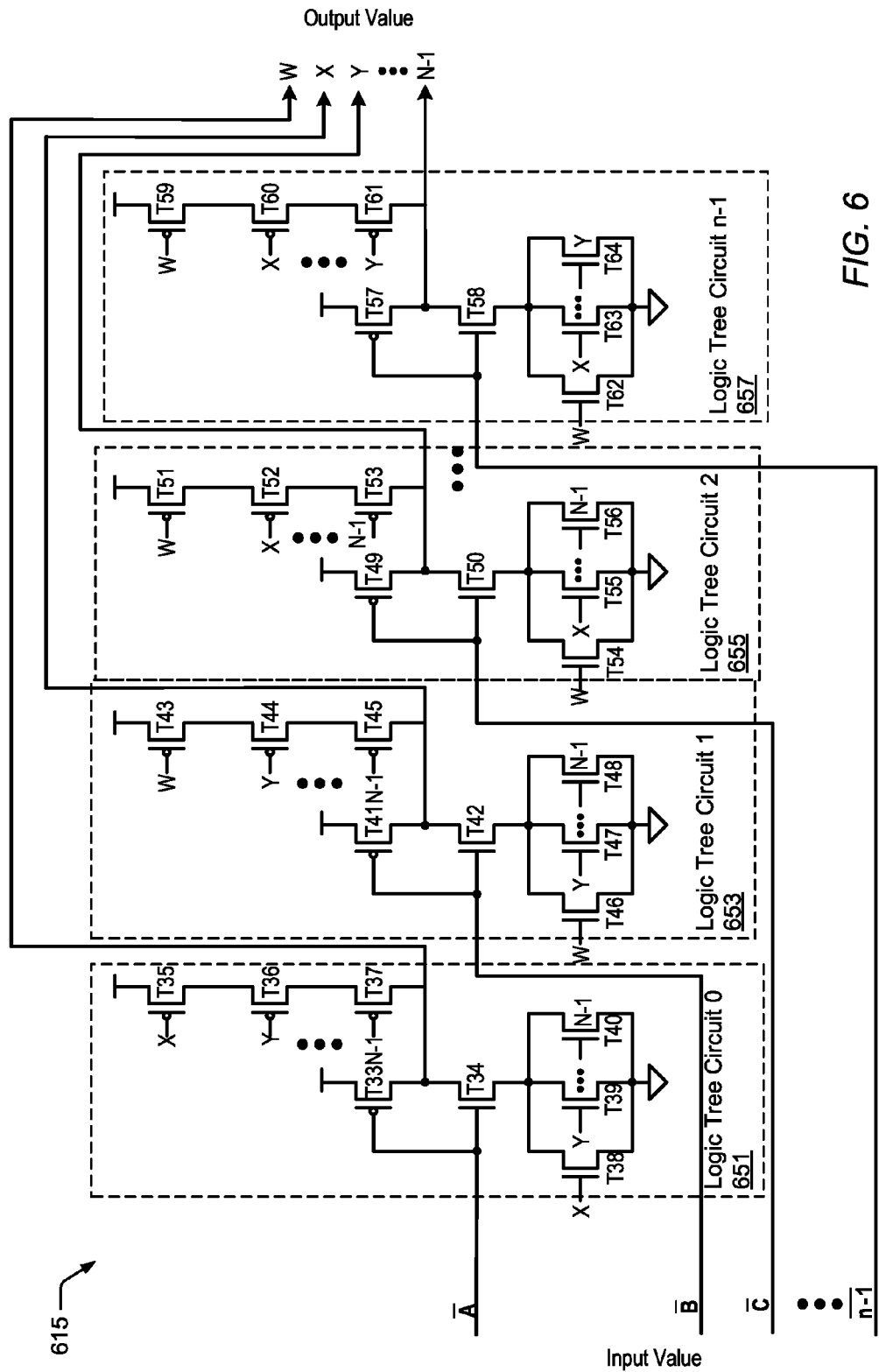
FIG. 6 is a block diagram of one embodiment of a one-of-n implementation of the storage cell of FIG. 1.

Referring now to FIG. 6, a block diagram of one embodiment of a block diagram of one embodiment of a one-of-n implementation of the storage cell of FIG. 1. The one-of-n storage cell 615 of FIG. 6 is similar to the one-of-four storage cell of FIG. 5. However, the signaling and the logic tree circuits are generalized for n signals, rather than four. Accordingly, there are n input signals that make up the input value and they are designated as $\overline{A}$ through $\overline{n-1}$. Likewise there are n output signals designated as W through n−1. There are also n logic tree circuits, designated 0 through n−1. In addition as mentioned above, there are n−1 p-type series-connected transistors and n−1 n-type parallel-connected transistors in each of the logic tree circuits designated T33-T64. The operation of the embodiment of FIG. 6 is similar to the operation of the embodiment shown in FIG. 5.

Figure 7:
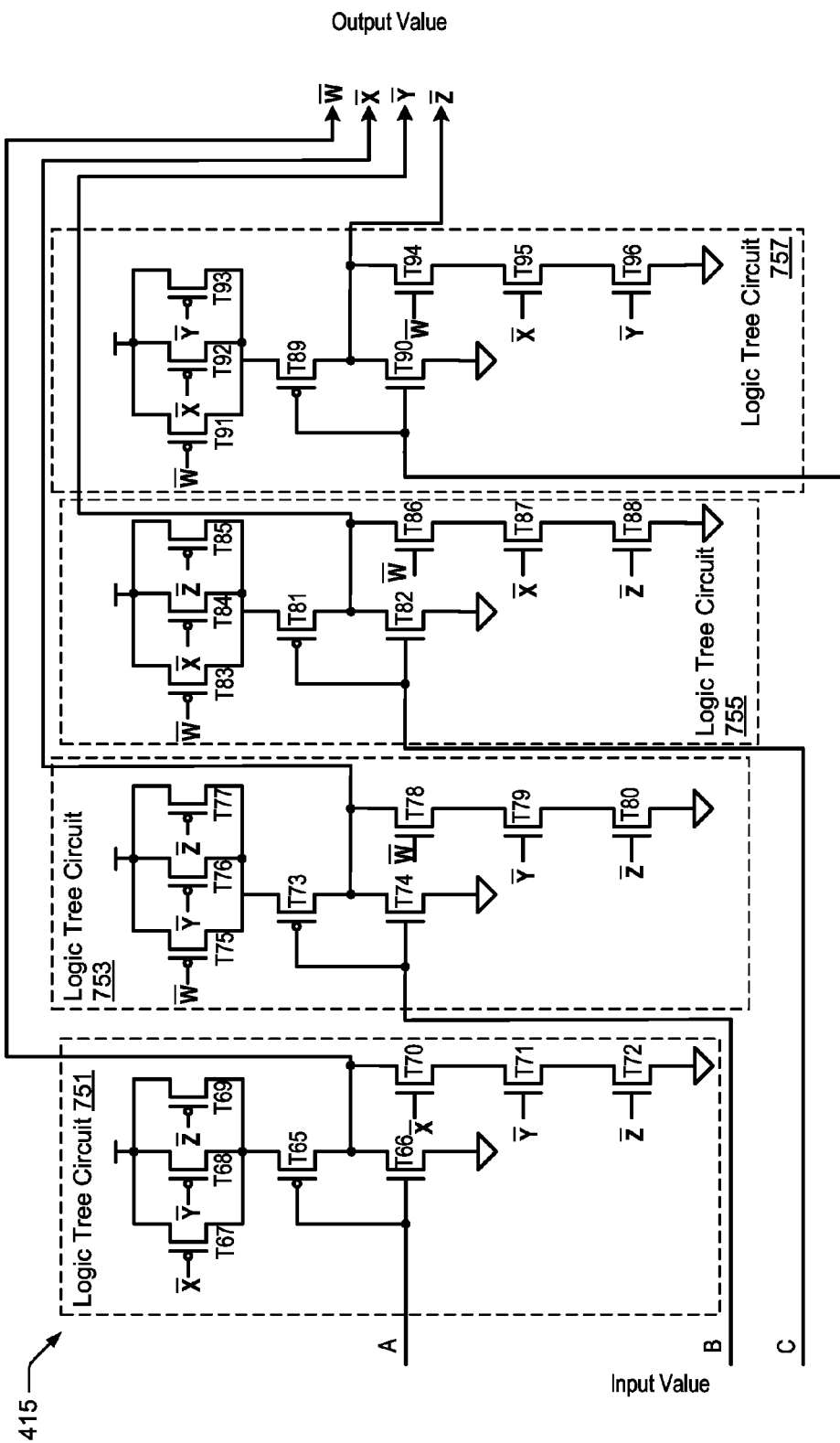
FIG. 7 is a block diagram of one embodiment of a one of four implementation of the storage cell of FIG. 4.

Turning to FIG. 7, a block diagram of one embodiment of a one of four implementation of the storage cell of FIG. 4 is shown. The one-of-four storage cell 415 of FIG. 7 is similar to the one-of-four storage cell of FIG. 5. However, the one-of-four storage cell 415 receives non-inverted NDL inputs and provides inverted outputs.

Accordingly, as shown in FIG. 7, the transistors 65-96 have been rearranged within the logic tree circuits 751-757. More particularly, each of the logic tree circuits still includes an input inverter having a p-type and an n-type transistor. However, in contrast to the embodiments shown in FIG. 5 and FIG. 6, each of the logic tree circuits of FIG. 7 includes three parallel-connected p-type transistors that are coupled between the voltage source and the p-type transistor of the input inverter. In addition, there are three series-connected n-type transistors coupled between the circuit ground reference and the output node of the logic tree circuit. The resulting input and output relationships are shown in the truth table of Table 2 below. Note that in this truth table, there are five valid input values, which are one-of four NDL input values. The top row of all logic zeros is the pre-charge input value.

TABLE 2

Truth table for the 1 of 4 storage cell of FIG. 7

| A | B | C | D | $\overline{W}$ | $\overline{X}$ | $\overline{Y}$ | $\overline{Z}$ |
|---|---|---|---|---|---|---|---|
| 0 | 0 | 0 | 0 | $\overline{W}$ | $\overline{X}$ | $\overline{Y}$ | $\overline{Z}$ |
| 0 | 0 | 0 | 1 | 1 | 1 | 1 | 0 |
| 0 | 0 | 1 | 0 | 1 | 1 | 0 | 1 |
| 0 | 1 | 0 | 0 | 1 | 0 | 1 | 1 |
| 1 | 0 | 0 | 0 | 0 | 1 | 1 | 1 |

It is noted that as described above, since downstream NDL gates may require one-hot signaling, in one embodiment, there may be local inversion (not shown in FIG. 7) at the output of the one-of-4 storage cell 415. This local inversion is shown in FIG. 4.

Figure 8:
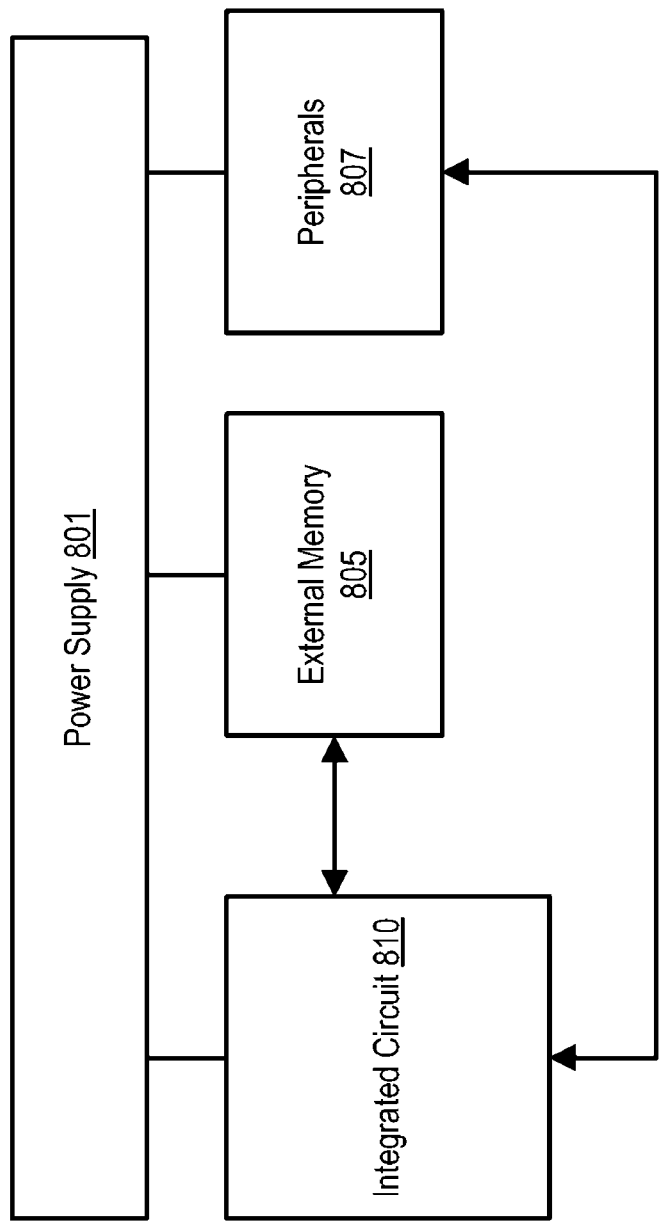
FIG. 8 is a block diagram of one embodiment of a system.

Turning to FIG. 8, a block diagram of one embodiment of a system is shown. The system 800 includes an integrated circuit 10 coupled to one or more peripherals 807 and an external system memory 805. The system 800 also includes a power supply 801 that may provide one or more supply voltages to the integrated circuit 10 as well as one or more supply voltages to the memory 805 and/or the peripherals 807.

In the illustrated embodiment, the system 800 includes at least one instance of the integrated circuit 810. The integrated circuit 810 may be representative of any of the integrated circuits 10, 210, 310, and 410 and include one or more instances of the one-of-n storage cell (from FIG. 1 through FIG. 7). The integrated circuit 810 may, in one embodiment, be a system on a chip including one or more instances of a processor core and various other circuitry such as a memory controller, video and/or audio processing circuitry, on-chip peripherals and/or peripheral interfaces to couple to off-chip peripherals, etc.

The peripherals 807 may include any desired circuitry, depending on the type of system. For example, in one embodiment, the system 800 may be included in a mobile device (e.g., personal digital assistant (PDA), smart phone, etc.) and the peripherals 807 may include devices for various types of wireless communication, such as WiFi, Bluetooth, cellular, global positioning system, etc. The peripherals 807 may also include additional storage, including RAM storage, solid-state storage, or disk storage. The peripherals 807 may include user interface devices such as a display screen, including touch display screens or multitouch display screens, keyboard or other input devices, microphones, speakers, etc. In other embodiments, the system 300 may be included in any type of computing system (e.g. desktop personal computer, laptop, workstation, net top etc.).

The external system memory 805 may include any type of memory. For example, the external memory 805 may be in the DRAM family such as synchronous DRAM (SDRAM), double data rate (DDR, DDR2, DDR3, etc.), or any low power version thereof. However, external memory 805 may also be implemented in SDRAM, static RAM (SRAM), or other types of RAM, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A storage cell comprising:
a plurality of logic tree circuits configured to receive an input value including a plurality of input signals and to provide a corresponding output value including a plurality of output signals in response to receiving the input value, wherein at least one of the plurality of input signals or the plurality of output signals correspond to N-Nary one-of-N signals, where N is greater than two;
wherein in response to receiving a precharge input value, the plurality of logic tree circuits is configured to output a last previous output value; and
wherein for each other input value, the plurality of logic tree circuits is configured to output a complemented input value;
wherein at least one of (1) the input value is an encoded value and in response to the plurality of input signals corresponding to N-Nary one-of-N signals, at most one signal of the input value is asserted to a logic value of one at any given time for a valid input value, and (2) the output value is an encoded value and in response to the plurality of output signals corresponding to N-Nary one-of-N signals, at most one signal of the output value is asserted to a logic value of one at any given time for a valid output value.

2. The storage cell as recited in claim 1, wherein the plurality of logic tree circuits includes one logic tree circuit for each input signal.

3. An integrated circuit comprising:
a storage cell including:
a plurality of logic tree circuits configured to receive an input value represented as a plurality of N-Nary one-of-N input signals where N is greater than two, the plurality of N-Nary input signals being implemented on a first set of physical wires;
the plurality of logic tree circuits is further configured to provide an output value represented as a plurality of output signals, the plurality of output signals being implemented on a second set of physical wires; and
wherein in response to a precharge input value the output value is unchanged, and for each other input value, the output value corresponds to a complemented input value.

4. The integrated circuit as recited in claim 3, wherein the input value is an encoded value, and at most one signal of the input value is asserted to a logic value of one at any given time for a valid input value.

5. The integrated circuit as recited in claim 4, wherein the encoding for the precharge input value has no signals at a logic value of one.

6. The integrated circuit as recited in claim 3, wherein the plurality of logic tree circuits includes one logic tree circuit for each input signal.

7. The integrated circuit as recited in claim 3, wherein each of the plurality of logic tree circuits includes:
an inverter coupled to receive a respective N-Nary one-of-N input signal;
a plurality of p-type transistors coupled in parallel between a voltage source and the inverter; and
a plurality of n-type transistors coupled in series between a circuit ground reference and a respective one of the plurality of N-Nary one-of-N output signals.

8. The integrated circuit as recited in claim 7, wherein the plurality of p-type transistors includes one p-type transistor for each of the output signals minus one.

9. The integrated circuit as recited in claim 7, wherein the plurality of n-type transistors includes one n-type transistor for each of the output signals minus one.

10. The integrated circuit as recited in claim 3, further comprising a plurality of inverter gates, each coupled to a respective logic tree circuit output and configured to provide an inverted output signal.

11. An integrated circuit comprising:
a storage cell including:
a plurality of logic tree circuits configured to receive an input value represented as a plurality of input signals, the plurality of input signals being implemented on a first set of physical wires;
the plurality of logic tree circuits is further configured to provide an output value represented as a plurality of N-Nary one-of-N output signals, where N is greater than 2, the plurality of N-Nary one-of-N output signals being implemented on a second set of physical wires; and
wherein in response to a precharge input value the output value is unchanged, and for each other input value, the output value corresponds to a complemented input value.

12. The integrated circuit as recited in claim 11, wherein the output value is an encoded value, and at most one signal of the output value is asserted to a logic value of one at any given time for a valid output value.

13. The integrated circuit as recited in claim 11, wherein the plurality of logic tree circuits includes one logic tree circuit for each input signal.

14. The integrated circuit as recited in claim 11, wherein each of the plurality of logic tree circuits includes:
an inverter coupled to receive a respective input signal;
a plurality of p-type transistors coupled in series between a voltage source and a respective one of the plurality of output signals; and
a plurality of n-type transistors coupled in parallel between a circuit ground reference and the inverter.

15. The integrated circuit as recited in claim 11, further comprising a plurality of inverter gates, each coupled to a respective logic tree circuit input and configured to provide an inverted input signal.

16. The integrated circuit as recited in claim 11, wherein the input value is an encoded value having at most one signal at a logic value of zero at any given time.

17. The integrated circuit as recited in claim 16, wherein the encoding for the precharge input value has no signals at a logic value of zero.

18. A storage cell comprising:
a plurality of logic tree circuits configured to receive a plurality of input values, wherein each input value includes a plurality of input signals;
wherein the plurality of logic tree circuits is further configured to provide a corresponding plurality of output values in response to receiving the input values, wherein each output value includes a plurality of N-Nary one-of-N output signals, where N is greater than two;
wherein each of the plurality of logic tree circuits is configured to receive a respective input signal and to provide a corresponding respective N-Nary one-of-N output signal;
wherein in response to receiving a precharge input value, the output value remains a previous output value, and for each other input value, the output value corresponds to a complemented input value;

wherein at least one of (1) the input value is an encoded value and in response to the plurality of input signals corresponding to N-Nary one-of-N signals, at most one signal of the input value is asserted to a logic value of one at any given time for a valid input value, and (2) the output value is an encoded value and in response to the plurality of output signals corresponding to N-Nary one-of-N signals, at most one signal of the output value is asserted to a logic value of one at any given time for a valid output value.

19. The storage cell as recited in claim 18, wherein the plurality of logic tree circuits includes one logic tree circuit for each input signal.

20. A storage cell comprising:
a plurality of logic tree circuits configured to receive a plurality of input values, wherein each input value includes a plurality of input signals;
wherein the plurality of logic tree circuits is further configured to provide a corresponding plurality of output values in response to receiving the input values, wherein each output value includes a plurality of N-Nary one-of-N output signals, where N is greater than two
wherein each of the plurality of logic tree circuits is configured to receive a respective input signal and to provide a corresponding respective N-Nary one-of-N output signal;
wherein in response to receiving a precharge input value, the output value remains a previous output value, and for each other input value, the output value corresponds to a complemented input value;
wherein each of the plurality of logic tree circuits includes:
an inverter coupled to receive a respective input signal;
a plurality of p-type transistors coupled in series between a voltage source and a respective one of the plurality of output signals; and
a plurality of n-type transistors coupled in parallel between a circuit ground reference and the inverter.

* * * * *